United States Patent [19]

McCaffrey et al.

[11] 4,047,217
[45] Sept. 6, 1977

[54] HIGH-GAIN, HIGH-VOLTAGE TRANSISTOR FOR LINEAR INTEGRATED CIRCUITS

[75] Inventors: Terence McCaffrey, Cupertino; Hassan Raza, Sunnyvale; Bruce C. Williams, San Jose, all of Calif.

[73] Assignee: Fairchild Camera and Instrument Corporation, Mountain View, Calif.

[21] Appl. No.: 676,038

[22] Filed: Apr. 12, 1976

[51] Int. Cl.² ............... H01L 29/72; H01L 29/00; H01L 27/02
[52] U.S. Cl. ........................... 357/34; 357/35; 357/37; 357/43; 357/48
[58] Field of Search ............... 357/34, 35, 37, 43, 357/47, 48, 50

[56] References Cited

U.S. PATENT DOCUMENTS

| 3,684,933 | 8/1972 | Schulz | 357/48 |
| 3,766,446 | 10/1973 | Tarui et al. | 357/48 |
| 3,841,918 | 10/1974 | Agraz-Guerena | 357/48 |
| 3,873,383 | 3/1975 | Kooi | 357/48 |
| 3,962,718 | 6/1976 | Inoue et al. | 357/48 |
| 3,971,059 | 7/1976 | Dunkley et al. | 357/48 |

*Primary Examiner*—Andrew J. James
*Attorney, Agent, or Firm*—Alan H. MacPherson; Henry K. Woodward

[57] ABSTRACT

A semiconductor structure for, and method of manufacture of, a linear integrated circuit provides the equivalent of a base function in a transistor, wherein the base function has a dual charge density, with the latter being relatively low in the lower active area of the base between PN junctions for high gain and high breakdown voltage, but high along the upper surface to prevent an unwanted inversion layer from occurring.

13 Claims, 9 Drawing Figures

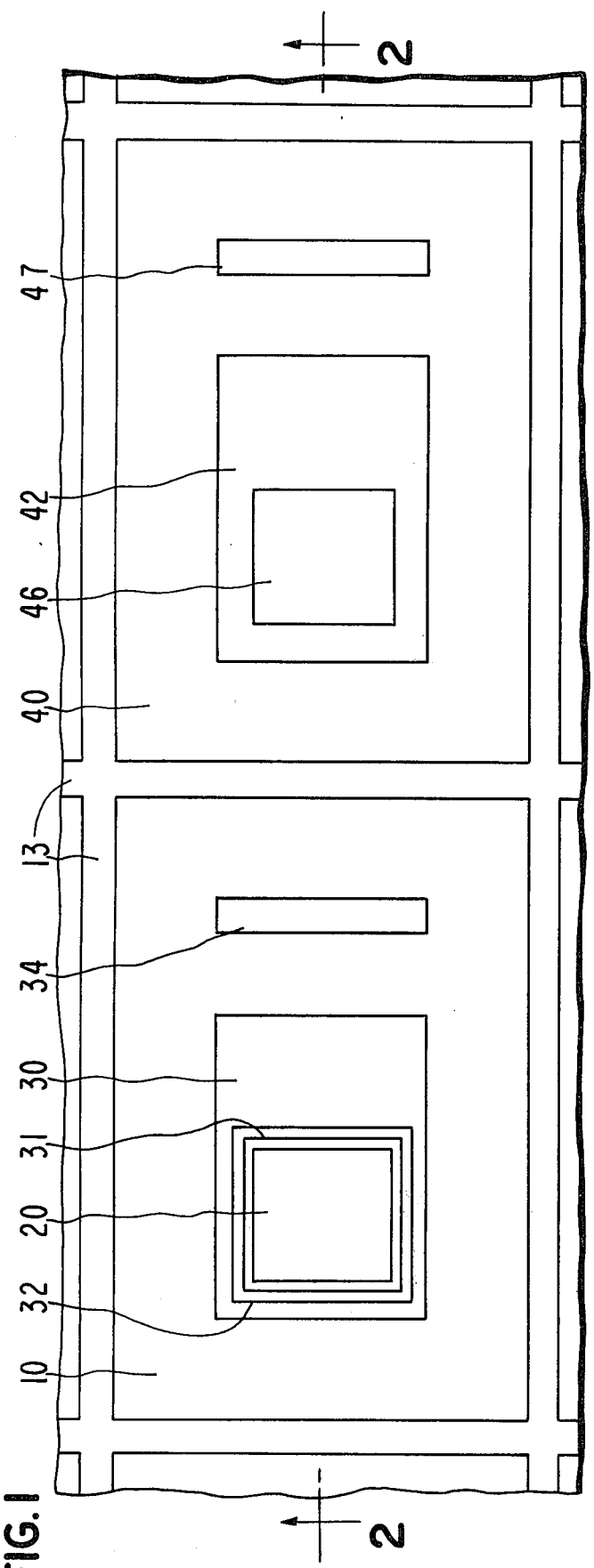
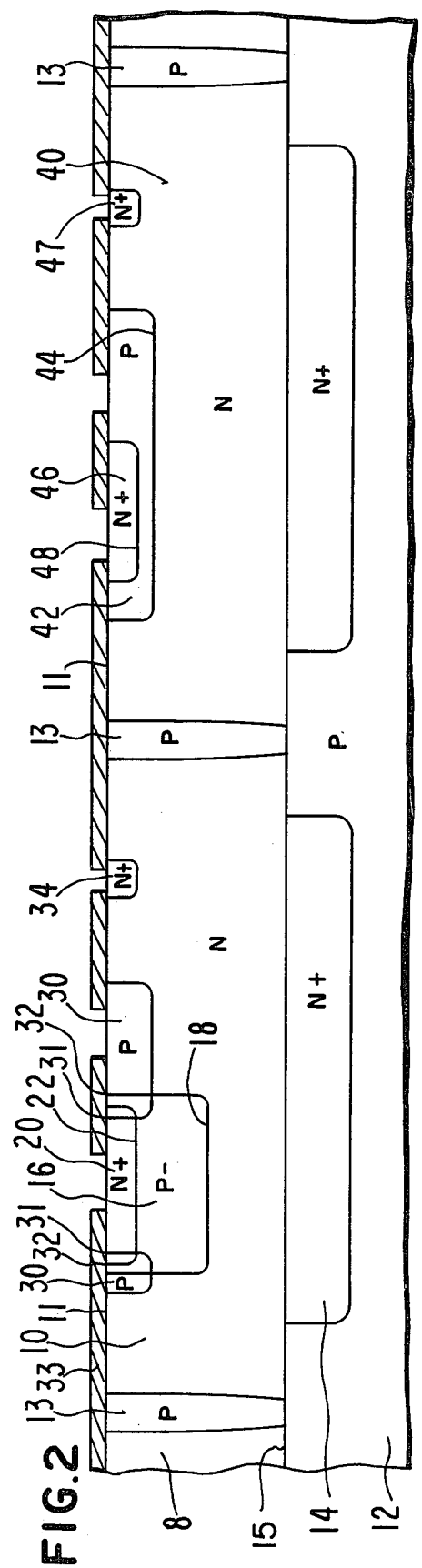

HIGH-GAIN, HIGH-VOLTAGE TRANSISTOR FOR LINEAR INTEGRATED CIRCUITS

BACKGROUND OF THE INVENTION

1. Field of the Invention

This invention relates to monolithic linear integrated circuits, and in particular, to linear integrated circuits wherein the input-stage transistor has both high gain and high breakdown voltage characteristics.

2. Description of the Prior Art

Monolithic integrated circuits useful for linear applications, such as operational amplifiers, should have an input-stage transistor with a relatively high forward-current transfer ratio, for example, above 1,000. As known in the art, the forward-current transfer ratio is the ratio of the output collector current to the input base current, and is referred to as the gain, or beta. The gain of a transistor is inversely proportional to the distance between its emitter-base PN junction and its collector-base PN junction, that is, the shorter the distance between the two PN junctions, the higher the gain. The gain also is inversely proportional to the charge density of the base region, that is, the lower the quantity of dopant atoms per cubic centimeter of P-type or N-type conductivity in the base region, the higher the gain, particularly in the active portion of the base between the emitter-base and collector-base PN junctions.

In addition, the input-stage transistor should have a relatively high breakdown voltage level, that is, the level of reverse-bias voltage required to cause breakdown to occur between the collector and emitter should be on the order of 40 to 45 volts.

Previously, it has been difficult, using standard semiconductor processing techniques, to fabricate transistors in linear integrated circuits that had both high gain and high emitter-collector breakdown voltage. It has also been difficult to fabricate linear integrated circuits in which one transistor had high gain but moderate breakdown voltage, such as about 10 volts, and another transistor had high breakdown voltage but moderate gain, such as above 150. Accordingly, compromises have had to be made, so that for many linear integrated circuits, at least two transistors are required, one to provide high gain at the input-stage, and the other to provide high breakdown voltage at the intermediate stages or at the output-stage, but with the high-gain transistor having low breakdown voltage, such as about 1.5 to 2 volts, and the high breakdown voltage transistor having low gain, such as about 50 to 150.

A prior-art method of fabricating a linear integrated circuit with at least two transistors of differing electrical characteristics comprises forming the high-gain input-stage transistor so that the distance between its collector-base and emitter-base PN junctions is relatively short, that is, not more than about three tenths of a micron, which is at least one-half of the typical distance between the two PN junctions of other transistors in the integrated circuit, a distance that usually varies from six tenths to one micron. The relatively short distance between the two PN junctions provides a relatively high gain, for example, in the range of 1,500 to 10,000, but the breakdown voltage between the two junctions, also referred to as the reach-through, or punch-through voltage, is undesirably low, such as about 1.5 to 2 volts, because the two junctions are so close together. A reach-through or punch-through effect occurs between two PN junctions when enough reverse-bias voltage is applied to one of the junctions to cause the latter to spread and electrically contact either the adjacent PN junction or an interconnection contact, resulting in a short circuit between the two PN junctions or between the spreading PN junction and the interconnection contact. The shorter the distance between junctions, the easier it is for one or both of them to spread and electrically contact each other.

Moreover, a very short distance between adjacent PN junctions in prior-art high-gain transistors causes fabrication difficulties using standard semiconductor processing techniques, because it is difficult to control easily the exact distance between the two PN junctions as the junctions are being formed. The collector, base, and emitter regions of a transistor are typically created by the diffusion of dopant atoms of N-type or P-type conductivity into a substrate of semiconductor material, wherein the concentration of the dopant atoms and the depth of the region are a function of the heat applied to cause the diffusion and the time period during which the diffusion occurs; when the distance between adjacent PN junctions has to be not more than three tenths of a micron. such a short distance makes it difficult to control accurately the exact depth of a PN junction and the distance between adjacent PN junctions. Consequently, with large-scale fabrication of numerous semiconductor devices on a wafer of semiconductor material. wide variations can occur in the electrical characteristics between devices. These wide variations substantially reduce the manufacturing yield and increase the production cost.

Typically, a second transistor, that is, one with high breakdown voltage, is formed on the substrate adjacent to the first, or high-gain, transistor. As mentioned above, the distance between the collector-base and emitter-base PN junctions of the second transistor is about six tenths to 1 micron. The longer distance between PN junctions provides a much higher collector-emitter breakdown voltage, such as about 40 to 45 volts, but the gain is relatively low to moderate, such as from 100 to 400. The two-transistor structure provides a compromise between the need for high gain and need for high breakdown voltage, but yield can be relatively low and manufacturing cost high because of problems in controlling the exact distance between adjacent PN junctions in the high-gain transistor when the distance cannot exceed three tenths of a micron.

In order to overcome some of the above-mentioned problems while fabricating an input-stage transistor with high gain, an alternative approach is used. In this approach, the base region is formed so that the charge density of dopant atoms therein is relatively low, such as about $10^{17}$ dopant atoms per cubic centimeter, which is about an order of magnitude less than the typical charge density of a base region. A base region with a low charge density means that the gain of the transistor is substantially increased. Moreover, the distance between the emitter-base and collector-base PN junctions of the transistor are not less than six tenths to 1 micron, so that the collector-emitter breakdown voltage is higher. However, when the base region has a low charge density, voltage potentials in the interconnect leads atop the passivation layer over the principal surface, for example, in the range of 20 to 40 volts, create an inversion layer along the upper surface portion of the base region. Such an inversion layer can cause a short circuit between the emitter and collector regions. Therefore, the alternative approach of using a base region with a low charge density is often undesirable because of the inversion layer problem.

A need thus exists for an improved monolithic integrated circuit structure useful for linear applications, such as an operational amplifier, wherein the transistor for the input-stage has both high gain and high breakdown voltage. The structure should be compatible with mass production semiconductor processing techniques and allow high yield with reduced cost as well as ensure consistent electrical characteristics between devices. In addition, the structure should prevent unwanted field inversion layers occurring along the surface of the base. Furthermore, the structure should eliminate the necessity of having two transistors, one for high gain and the other for high breakdown voltage.

BRIEF DESCRIPTION OF THE INVENTION

The structure of the invention and method of making it overcomes the above-mentioned problems of prior-art devices in that it provides an input-stage transistor having both high gain and high breakdown voltage, is compatible with standard semiconductor processing techniques, and enables the electrical characteristics between devices to be substantially similar.

Briefly, the structure of the invention provides the equivalent of a base function that has a dual charge density, with the latter being low in the lower active area of the base for high gain, but high along the surface to prevent an inversion layer. The structure comprises a layer of semiconductor material having a principal surface, with a collector region of one conductivity type, such as N-type conductivity, located therein. Located in the collector is a base region of opposite conductivity type, such as P-type conductivity, which forms a first PN junction therewith that extends to have an edge at the principal surface. The charge density of the base is relatively low, such as about $10^{17}$ dopant atoms per cubic centimeter. An emitter region of the one conductivity type, that is, N-type conductivity, is located within the base and forms a second PN junction therewith, the junction extending to have an edge at the principal surface. A base cap region of opposite conductivity type, that is, P-type conductivity, with a charge density about an order of magnitude greater than that of the base, is located along a portion of the principal surface and extends therefrom into portions of the collector, base, and emitter to prevent unwanted surface inversion from occurring in the base. Overlying the principal surface is a layer of passivation material such as oxide, with portions thereof removed to expose portions of the collector, base and emitter so that electrical contact can be made thereto.

Briefly, the method of forming the structure of the invention to provide the equivalent of a base with a dual charge density comprises the steps of forming a semiconductor layer of one conductivity type, such as N-type conductivity, the layer having a principal surface; diffusing dopant atoms of opposite conductivity type, such as P-type conductivity, from the surface into the layer to form a base region and a first PN junction between the layer and base region, the junction extending to have an edge at the principal surface, the base having a relatively low charge density of dopant atoms per cubic centimeter; diffusing dopant atoms of opposite conductivity type, that is, of P-type conductivity, from a portion of the principal surface into the layer and base region to form a base cap region having a charge density about an order of magnitude greater than that of the base; and diffusing dopant atoms of the one conductivity type, that is, N-type conductivity, from the principal surface into a portion of the base to form a second PN junction therewith, the junction extending to have an edge at the principal surface, and a portion of the emitter overlapping a portion of the base cap in the base, so that the base cap extends along the principal surface from the layer through the base and into the emitter.

BRIEF DESCRIPTION OF THE DRAWINGS

FIG. 1 is a simplified top view of a portion of an integrated circuit showing the transistor structure of the invention adjacent to another transistor.

FIG. 2 is a simplified cross-sectional view along the lines 2—2 of FIG. 1 showing the transistor structure of the invention adjacent to another transistor.

DESCRIPTION OF THE PREFERRED EMBODIMENTS

Figure 3:
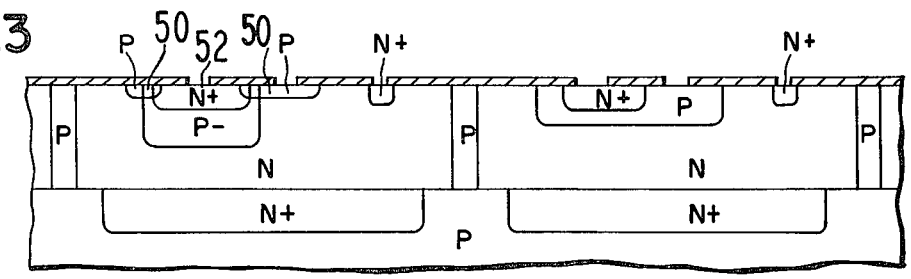
FIGS. 3 and 4 are simplified cross-sectional views of alternative embodiments of the invention.

Referring to FIGS. 1 and 2, the device according to the invention comprises a layer 8 of semiconductor material, such as silicon, in which is located a collector region 10 of one conductivity type, such as N-type conductivity, having a principal surface 11. Layer 8 suitably is supported by a substrate 12 of semiconductor material, which is of opposite conductivity type from that of the collector 10, and is, for example, of P-type conductivity. Collector 10 is electrically isolated from adjacent areas of layer 8 by regions 13 of P-type conductivity that extend through the collector 10 between its upper and lower surfaces to the upper surface 15 of supporting substrate 12. Regions 13 divide semiconductor layer 8 into a plurality of pockets of semiconductor material electrically isolated from each other. An active circuit element, such as a transistor or diode, can be formed in each pocket. Suitably, an underlying region 14 of N-type conductivity and relatively high charge density, such as about $10^{21}$ dopant atoms per cubic centimeter, is located along a portion of the upper surface 15 of supporting substrate 12 and functions to delineate the path of electron flow through the collector 10.

Located within the collector 10 is a base region 16 of opposite conductivity type, that is, of P-type conductivity, that forms a first PN junction 18 with collector 10, the junction having an edge at the principal surface 11. Suitably, the collector-base PN junction 18 is relatively deep, with the distance between the principal surface 11 and the deepest portion of junction 18 being on the order of about 8 to 9 microns. In addition, base 16 has a relatively low charge density, such as about $10^{17}$ dopant atoms per cubic centimeter, which is indicated in FIGS. 1 and 2 by the symbol "P-".

An emitter region 20 of the one conductivity type, that is, of N-type conductivity, is located within base 16 and forms a second PN junction 22 therewith, the junction 22 having an edge at the principal surface 11. Suitably, the charge density of the emitter region is relatively high, being on the order of about $10^{21}$ dopant atoms per cubic centimeters, which is indicated in FIGS. 1 and 2 by the symbol "N+." The deepest portion of the emitter-base PN junction 22 is at a distance of about three microns from the principal surface 11, so that the distance between the collector-base PN junction 18 and the emitter-base PN junction 22 is about 5 to 6 microns.

As mentioned above, the charge density of the base 16 is relatively low, particularly in the lower active area of base 16 between the two PN junctions 18 and 22, and the gain, defined by the ratio of collector current to base current, is relatively high, such as on the order of 1,000 to 4,000. Moreover, the relatively long distance of 5 to 6 microns between the two PN junctions 18 and 22 means that the punch-through, or reach-through voltage, which is the reverse-bias voltage necessary to cause a short to occur between PN junctions 18 and 22, or between PN junction 18 or 22 and an electrical contact, is relatively high, such as on the order of 45 to 65 volts. The structure of the transistor thus provides relatively high gain and relatively high breakdown voltage.

Unfortunately, because of the low charge density in the base region 16, voltage potentials as low as 10 volts in interconnection layers or leads above the principal surface 22 can cause an inversion layer to appear along the principal surface 11 over base 16. Such an inversion layer can result in an electrical short between the two PN junctions 18 and 22, or between a PN junction and an electrical contact. In order to prevent unwanted inversion, a base cap region 30 of the same conductivity type as base 16 but with a substantially higher charge density is located along a portion of the principal surface 11, with region 30 extending into a portion of the collector 10, base 16, and emitter 20. Base cap 30 surrounds the surface edge 32 of the collector-base PN junction 18, and suitably has a charge density about an order of magnitude higher than that of base 16; for example, about $10^{18}$ dopant atoms per cubic centimeter. The higher charge density of base cap 30 prevents an unwanted inversion layer from appearing along the surface 11. Use of base cap 30 enables base 16 to have a low charge density in the lower active area between the two PN junctions and thereby substantially increase the gain without the danger of a surface inversion layer appearing. In FIG. 3, the depth of base cap 30 is greater than that of emitter 20 but less than that of base 18, and the distance from its deepest portion to the principal surface 11 is, for example, about 3.5 microns. In addition to providing a transistor with high gain, high breakdown voltage and without surface inversion problems, the structure of the invention reduces noise, lowers base resistance, lowers surface leakage, and improves transistor matching.

Located over the principal surface 11 is a layer of passivation material 33, such as silicon dioxide. Portions of the passivation layer 33 are removed to expose portions of the collector 10, base cap 30, and emitter 20 along the principal surface 11 so that electrical contact can be made thereto. The exposed portions of the collector, base cap and emitter are away from locations where the first and second PN junctions 18 and 22 have an edge at the principal surface 11. A portion 34 of collector 10 at the principal surface 11 comprises an area of high charge density, such as $10^{21}$ dopant atoms per cubic centimeter, to enable better electrical contact to be made to the collector 10.

In an adjacent pocket 40, another transistor is located, suitable for intermediate and output stages of a linear integrated circuit. The adjacent transistor comprises a collector region 40 of N-type conductivity, for example. A base region 42 of P-type conductivity is located within collector 40 and forms a collector-base PN junction 44 therewith having an edge at the principal surface 11. An emitter region 46 is located within the base 42 and forms an emitter-base PN junction 48 therewith having an edge at the principal surface 11. The charge density of base 42 is about $10^{18}$ dopant atoms per cubic centimeter, resulting in a gain that is substantially lower than that of the previously described transistor in the adjacent pocket. However, the distance between the collector-base and emitter-base PN junctions 44 and 48 is about six tenths to 1 micron, so that the reverse-bias breakdown voltage is relatively high. For many applications, it may be desirable to eliminate the second transistor in the adjacent pocket, as the first transistor now has both high gain and high breakdown voltage.

Referring to FIG. 3, an alternative embodiment of the invention comprises the base cap region 50 in which its deepest portion is of a depth that is less than that of the emitter region 52.

Figure 4:
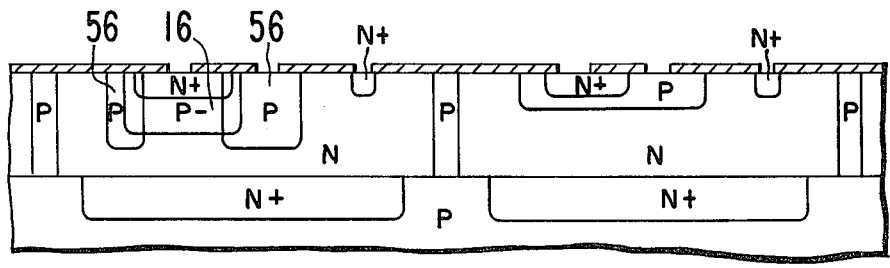

Referring to FIG. 4, another alternative embodiment of the invention comprises the base cap region 56 in which its deepest portion is of a depth that is greater than that of the base 16.

Figure 5:
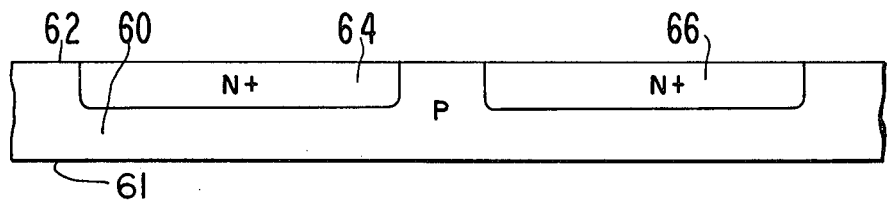
FIGS. 5 through 9 are simplified cross-sectional views of the transistor structure of the invention adjacent to another transistor during various steps of their fabrication.

Referring to FIG. 5, the method of making the high-gain, high-breakdown-voltage transistor structure of the invention comprises the steps of forming a substrate 60 of semiconductor material, such as silicon, of one conductivity type, such as P-type conductivity, that has upper and lower surfaces 62 and 61, respectively. Substrate 60 provides support for an epitaxial layer that is grown thereover during a subsequent step. Dopant atoms of opposite conductivity type, such as N-type conductivity, are diffused into the substrate 60 from the upper surface 62 to form a plurality of regions 64 and 66 spaced apart from each other.

Figure 6:
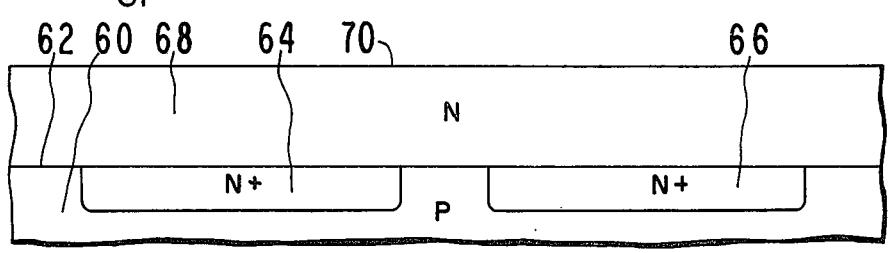

Referring to FIG. 6, a layer 68 of epitaxial semiconductor material, such as silicon, is next grown over the upper surface 62 of substrate 60. Epitaxial layer 68 is about ten to fifteen microns thick, is of N-type conductivity, and has an upper principal surface 70.

Figure 7:
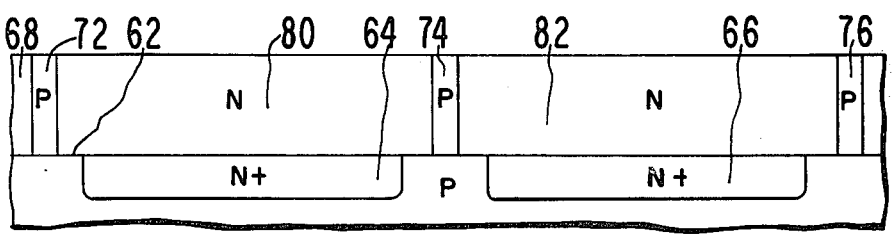

Referring to FIG. 7, dopant atoms of P-type conductivity are diffused into epitaxial layer 68 to form regions 71, 74 and 76 that extend from the principal surface 70 through layer 68 to the upper surface 62 of substrate 60. Regions 72, 74 and 76 electrically isolate pockets of semiconductor material, such as pockets 80 and 82, from each other. The electrically isolated pockets 80 and 82 of N-type conductivity in epitaxial layer 68 can now function as the collectors of individual transistors. Preferably each of the pockets 80 or 82 is aligned over an underlying region 64 or 66, respectively.

Figure 8:
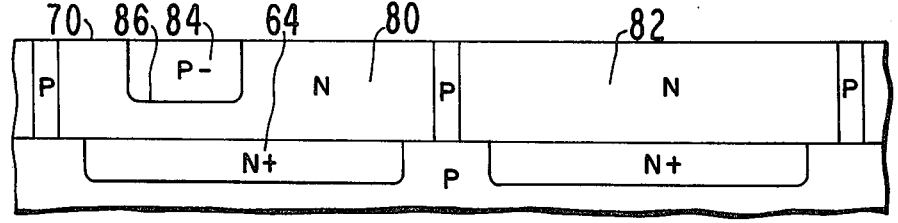

Referring to FIG. 8, dopant atoms of P-type conductivity are diffused into collector region 80 from the principal surface 70 to form the base region 84. A first PN junction 86 is created therebetween that extends to have an edge at surface 70. Preferably, the diffusion step is at a temperature and for a time period sufficient to create a relatively deep PN junction 86. For example, the distance between principal surface 70 and the deepest portion of junction 86 is about 8 to 9 microns. With such a deep junction 86, the charge density of the base 84 will be relatively low, such as about $10^{17}$ dopant atoms per cubic centimeter. Preferably, base 84 is aligned over the underlying region 64.

Figure 9:
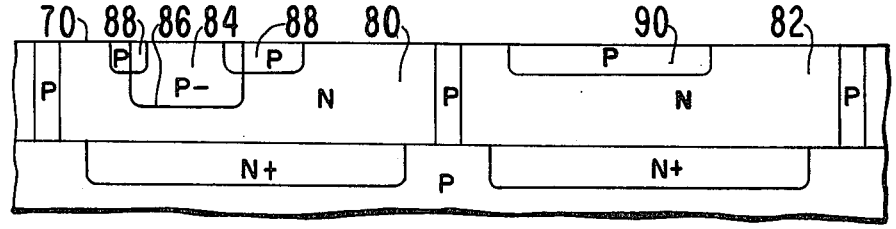

Referring to FIG. 9, dopant atoms of P-type conductivity are diffused from the principal surface 60 into portions of conductor 80 and base 84 to form a base cap region 88. Suitably, the base cap 88 surrounds base 84, and in particular overlaps the collector-base PN junction 86 where the edge appears at the principal surface 70. In one embodiment, base cap 88 is not as deep as the base 84, and by way of example, its deepest portion is a distance of about 5 microns from the principal surface 70. Preferably, the charge density of the base cap 88 is about an order of magnitude greater than that of the base 84, and for example, is about $10^{18}$ dopant atoms per cubic centimeter. During the step of forming the base cap 88, it may be desirable to form a base region 90 in the adjacent pocket 82, in which case the charge density of base 90 will be about the same as that of the base cap 88.

Dopant atoms of N-type conductivity are next diffused into the base 84 from the principal surface 70 to form the emitter region (shown as region 20 in FIG. 2). During this step, a contact region for the collector (region 34 in FIG. 2) and, in the other pocket, an emitter region (region 46 in FIG. 2) and a collector contact region (region 47 in FIG. 2) are formed. Each of these regions is relatively shallow, with the distance from the principal surface to the deepest portion being about 3 microns. Also, the charge density is relatively high, for example, on the order of about $10^{21}$ dopant atoms per cubic centimeter. It is understood that a layer of passivation material, such as oxide, is located over the principal surface, even though not shown in FIGS. 5 through 9, and the various diffusion steps mentioned above include the sub-steps of removing a portion of the passivation layer to expose a portion of the principal surface prior to the diffusion, and reforming the passivation layer over the exposed surface after the diffusion step. Moreover, it is understood that additional steps of forming interconnect leads over the passivation layer that extend to make electrical contact to the collector, base, and emitter are performed during a subsequent step. However, such steps are well known in the semiconductor field and in the interest of brevity, a detailed description has not been given.

We claim:

1. An improved bipolar transistor device having a high breakdown voltage and high gain comprising:
   a first collector region of semiconductor material of one conductivity type having a principal surface;
   a second base region of opposite conductivity type located within the first collector region and forming a first p-n junction herewith that has an edge at the principal surface, the second base region having a relatively low charge density;
   a third emitter region of one conductivity type located within the second base region and forming a second p-n junction therewith that has an edge at the principal surface; and a fourth base region of opposite conductivity type located along a portion of the principal surface abutting the entire periphery of said third region and extending into portions of the first, second, and third regions, the fourth region having a charge density about an order of magnitude greater than that of the second region, said fourth base region and said second base region providing the equivalent of a base function with a dual charge density.

2. Device of claim 1 further defined by a layer of passivation material located over the principal surface with portions removed to expose portions of the first, second and third regions to enable electrical contact to be made thereto.

3. Device of claim 1 wherein the second region is deeper than the fourth region.

4. Device of claim 1 wherein the fourth region is deeper than the second region.

5. Device of claim 1 wherein the fourth region is deeper than the third region.

6. Device of claim 1 wherein the third region is deeper than the fourth region.

7. Device of claim 1 wherein the charge density of the second region is about $10^{17}$ dopant atoms per cubic centimeter.

8. Device of claim 1 wherein the one conductivity type is N-type conductivity, and the opposite conductivity type is P-type conductivity.

9. Device of claim 1 further defined by the first region being in a pocket located in a layer of epitaxial semiconductor material, the epitaxial layer having a plurality of pockets, with each pocket electrically isolated from other pockets in the epitaxial layer.

10. Device of claim 9 further defined by the epitaxial layer resting upon and supported by a substrate of semiconductor material of opposite conductivity type.

11. In a bipolar transistor device comprising a collector including a first region of semiconductor material of one conductivity type having a principal surface; a base including a second region of opposite conductivity type located within the first region to form a first p-n junction therewith, the junction having an edge at the principal surface; an emitter including a third region of one conductivity type located within the second region to form a second p-n junction therewith, the junction having an edge at the principal surface; the improvement comprising the second region further defined by a relative low charge density and said base including a fourth region of opposite conductivity type having a charge density of an order of magnitude greater than the second region, the fourth region located along a portion of the principal surface abutting the entire periphery of said third region and extending into portions of the first, second, and third regions.

12. Device of claim 11 wherein the charge density of the first region is about $10^{17}$ dopant atoms per cubic centimeter.

13. Device of claim 11 wherein the one conductivity type is N-type conductivity and the opposite conductivity type is P-type conductivity.

* * * * *